(12) United States Patent
Tsuboi et al.

(10) Patent No.: US 6,971,052 B2
(45) Date of Patent: Nov. 29, 2005

(54) SEMICONDUCTOR INTEGRATED CIRCUIT AND METHOD FOR TESTING THE SAME

(75) Inventors: Hiroyoshi Tsuboi, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 10/255,671

(22) Filed: Sep. 27, 2002

(65) Prior Publication Data

US 2003/0102885 A1 Jun. 5, 2003

(30) Foreign Application Priority Data

Nov. 20, 2001 (JP) .............................. 2001-354403

(51) Int. Cl.[7] .............................................. G11C 29/00
(52) U.S. Cl. ..................................... 714/718; 714/724
(58) Field of Search ............................... 714/718, 724, 714/699, 100, 25, 30, 32, 37, 40, 48, 763, 714/710; 360/53; 365/201

(56) References Cited

U.S. PATENT DOCUMENTS 5,119,335 A * 6/1992 Nozaki ........................ 365/190
5,514,991 A * 5/1996 Uehara et al. ................ 327/154
5,751,944 A * 5/1998 Roohparvar et al. ......... 714/42
2002/0178414 A1* 11/2002 Roohparvar ................. 714/718

FOREIGN PATENT DOCUMENTS

JP         2001-243796        9/2001
JP         2001-243797        9/2001

* cited by examiner

*Primary Examiner*—Albert Decady
*Assistant Examiner*—Dipakkumar Gandhi
(74) *Attorney, Agent, or Firm*—Arent Fox PLLC

(57) ABSTRACT

When a test command is received n times, any one of a plurality of tests is started. After the first test is started, any one of the tests is started or terminated every time the test command is received a predetermined number of times which is less than the n times. The number of times of the test command supplied to start or terminate the second and subsequent tests can be less than that of the first test. Accordingly, the time of the second and subsequent tests can be shortened. Since the first test is started only when the test command is received n times, the test is not started accidentally due to noise or the like in normal operation. Namely, the test time can be shortened without decreasing the operation reliability of an integrated circuit. Particularly, when a plurality of tests is executed successively, great benefit can be obtained.

10 Claims, 8 Drawing Sheets

SEMICONDUCTOR INTEGRATED CIRCUIT AND METHOD FOR TESTING THE SAME

BACKGROUND OF THE INVENTION

1. Field of the Invention

The present invention relates to a semiconductor integrated circuit having a test mode.

2. Description of the Related Art

As a semiconductor integrated circuit having a test mode, for example, a technique disclosed in Japanese Unexamined Patent Application Publication No. Hei 2000-243797 is known. This semiconductor integrated circuit shifts to the test mode when a test command is inputted a plurality of times in a normal operation mode. Therefore, the semiconductor integrated circuit is prevented from shifting to the test mode accidentally in normal operation.

However, for example, when a plurality of tests are executed after the semiconductor integrated circuit is fabricated, it is necessary to input a command signal a plurality of times for each test. It is also necessary to input the command signal a plurality of times to shift an operation mode in the semiconductor integrated circuit from the test mode to the normal operation mode after each test is terminated. Hence, there is a problem that, when a plurality of the tests are executed successively, the command signal needs to be inputted many times, thereby increasing the test time.

SUMMARY OF THE INVENTION

It is an object of the present invention to provide a semiconductor integrated circuit, which securely shifts its operation mode from a normal operation mode to a test mode and is capable of shortening the test time.

According to one of the aspects of the present invention, in the integrated circuit, an initial entry signal which starts any one of a plurality of tests is outputted when a test command is received n times. Then, after the initial entry signal is outputted, subsequent entry signals which start or terminate any one of the tests are outputted every time the test command is received a predetermined number of times which is less than the n times. The entry signals are outputted, for example, from an entry circuit which receives the test command.

In the present invention, the number of times of the test command, which is supplied to start the second and subsequent tests or terminate the tests, can be less than that for the first test. Accordingly, the time of the second and subsequent tests can be shortened. The first test is started only when the test command is received n times. Hence, there is no case that the entry signal is generated accidentally due to noise or the like to execute the test in normal operation. Namely, the test time can be shortened without decreasing the operation reliability of the integrated circuit. Particularly, when a plurality of the tests is executed successively, great benefit can be obtained.

According to another aspect of the present invention, the start or the termination of the tests is identified in accordance with address signals which are supplied to address terminals together with the test command. For example, a test control circuit formed in the integrated circuit receives the address signals and outputs test control signals which control the start or the termination of the tests in synchronization with each of the entry signals. Accordingly, whether the test should be started or terminated can be easily identified in accordance with the test command received. Further, since the address terminals used in the normal operation can be also used as test terminals, it is unnecessary to newly form the test terminals. As a result, the chip size can be prevented from increasing.

According to another aspect of the present invention, the semiconductor integrated circuit includes a memory core having a plurality of memory cells and bit lines for transmitting data, which are read, from the memory cells. Further, the tests started by the entry signals include a burn-in test of the memory cells and a precharge operation test for resetting the bit lines to a predetermined voltage after the burn-in test. In general, the burn-in test is executed to remove initial failure by continuing operation of the integrated circuit for a predetermined period. Accordingly, the time of the burn-in test is longer as compared with that of other tests. Hence, applying the present invention to the start and the termination of the burn-in test produces large effect of shortening the test time.

According to another aspect of the present invention, the entry circuit includes a first circuit, a second circuit, and a mask circuit. The first circuit generates a first entry signal when it receives the test command n times. The second circuit generates a second entry signal every time it receives the test command a predetermined number of times. The mask circuit masks the second entry signal until the initial entry signal is outputted, and masks the first entry signal after the initial entry signal is outputted. The mask circuit outputs the first or the second entry signal, which is not masked, as the initial or subsequent entry signal. Hence, the entry signals can be easily generated by a simple circuit.

According to another aspect of the present invention, the test command is recognized by a combination of command signals, which is not used in the normal operation, out of command signals supplied to command terminals, which are composed of a plurality of bits. Namely, the command terminals used in the normal operation can be also used as the test terminals for executing the test. As a result, it is unnecessary to newly form the test terminals and thus the chip size can be prevented from increasing.

According to another aspect of the present invention, when the initial entry signal is outputted, an operation mode in the integrated circuit shifts from the normal operation mode to the test mode. In the test mode, it is possible to stop operation of a circuit which is used only in the normal operation. Accordingly, even when the number of times the second and subsequent test commands are received is reduced to be less than the number of times the first test command is received, the operation reliability of the integrated circuit is not decreased.

According to another aspect of the present invention, after the initial entry signal is outputted, the subsequent entry signals are outputted every time the test command is received once. After the shift to the test mode, the test is started and terminated by receiving the test command a minimum number of times, thereby shortening the test time significantly as compared with that of the conventional art. Since it is necessary to receive the test command a plurality of times in order to execute the first test, there is no case that the entry signal is generated accidentally due to noise or the like to execute the test in the normal operation.

According to another aspect of the present invention, in the normal operation mode, a test request is recognized to shift the operation mode in the integrated circuit to the test mode when the test command is received n times. Then, in accordance with the address signals supplied to the address terminals together with the test command, any one of a plurality of the tests is executed. In the test mode, the test request is recognized every time the test command is received a predetermined number of times which is less than the n times, and any one of the tests is executed in accordance with the address signals supplied together with the test command. Alternatively, the operation mode in the integrated circuit shifts from the test mode to the normal operation mode. Also in the present invention, the time required for the second and subsequent tests can be shortened. There is no case that the entry signal is generated accidentally due to noise or the like to execute the test in the normal operation. Hence, the test time can be shortened without decreasing the operation reliability of the integrated circuit. In addition, the test to be started or terminated can be easily identified among a plurality of test items. Since the address terminals used in the normal operation can be also used as the test terminals, it is unnecessary to newly form the test terminals, and thus the chip size can be prevented from increasing.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Figure 1:
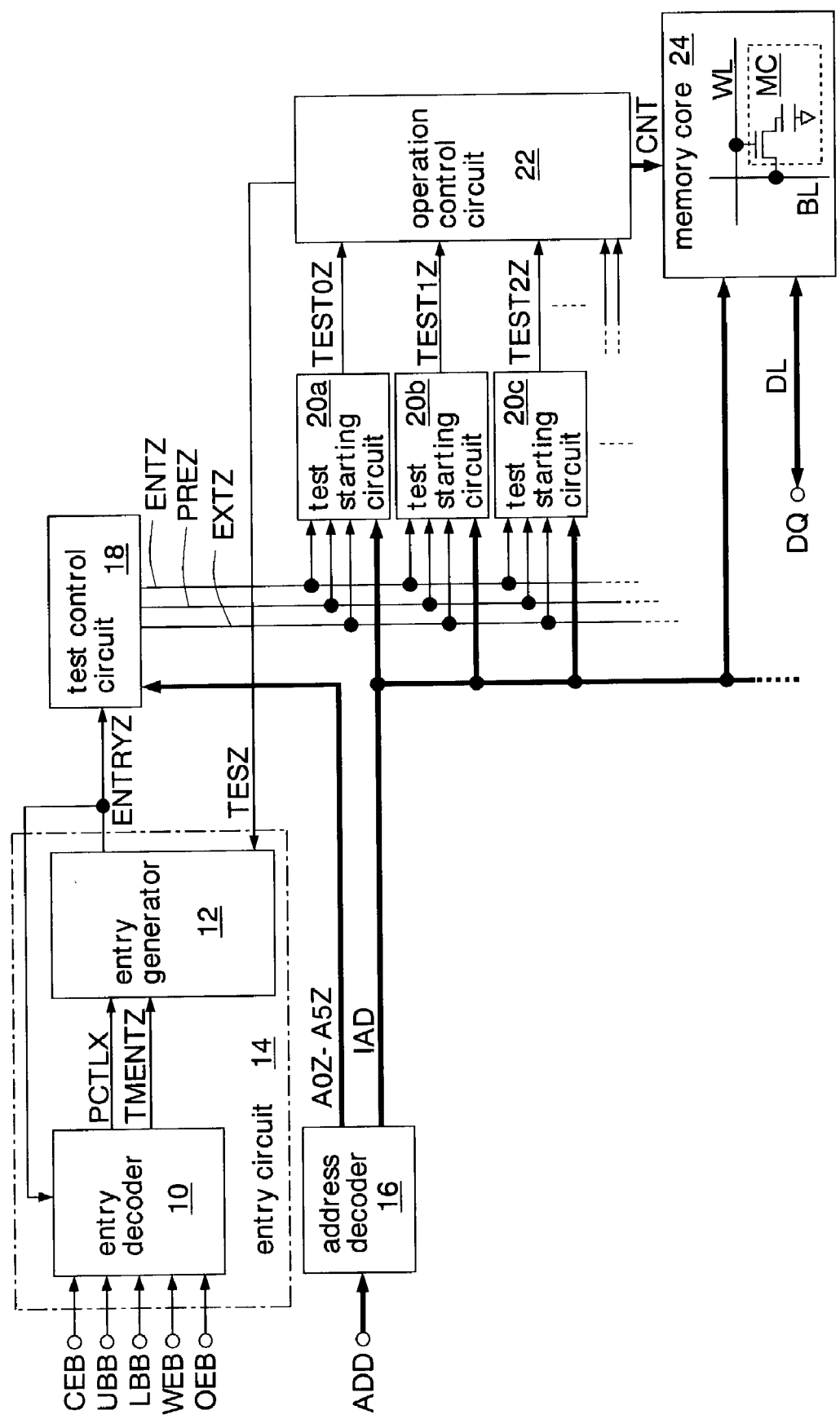
FIG. 1 is a block diagram showing one embodiment of a semiconductor integrated circuit of the present invention.

Hereinafter, a preferred embodiment of the present invention will be explained with reference to the drawings. In the drawing, each of signal lines shown by bold lines consists of a plurality of lines. A signal whose last digit is "Z" shows a positive logic and a signal whose last digit is "B" or "X" shows a negative logic.

FIG. 1 shows one embodiment of a semiconductor integrated circuit of the present invention. This semiconductor integrated circuit is formed on a silicon substrate as a clock asynchronous DRAM through the use of a CMOS process. The DRAM has an entry circuit 14 including an entry decoder 10 and an entry generator 12, an address decoder 16, a test control circuit 18, a plurality of test starting circuits 20 (20a, 20b, 20c, ...), an operation control circuit 22, and a memory core 24. In the drawing, round marks at ends of the signal lines show exterior terminals.

The entry decoder 10 receives command signals CMD (a chip enable signal CEB, an upper byte signal UBB, a lower byte signal LBB, a write enable signal WEB, and an output enable signal OEB) from the exterior of the DRAM, receives an entry signal ENTRYZ from the entry generator 12, and outputs a first entry signal TMENTZ or a second entry signal PCTLX. The chip enable signal CEB, the upper byte signal UBB, the lower byte signal LBB, the write enable signal WEB, and the output enable signal OEB are supplied via respective command terminals (a chip enable terminal, an upper byte terminal, a lower byte terminal, a write enable terminal, and an output enable terminal). The chip enable signal CEB, the upper byte signal UBB, the lower byte signal LBB, the write enable signal WEB, and the output enable signal OEB are the command signals CMD which are used in normal operation (a normal operation mode) such as read operation or write operation and in a test mode which will be described later. The entry generator 12 receives the first and the second entry signals TMENTZ and PCTLX and a test mode signal TESZ, and outputs the entry signal ENTRYZ. The entry signal ENTRYZ is a test request outputted to the test control circuit 18 in order to start or terminate a test.

The address decoder 16 receives address signals ADD, which are supplied from the exterior of the DRAM, and outputs internal address signals A0Z to A5Z and IAD. When lower three bits of the address signals ADD show "0 to 5", the internal address signals A0Z to A5Z are changed to the high level respectively. The internal address signals IAD are positive logic signals and negative logic signals, which are generated for each bit (the fourth and subsequent bits) of the address signals ADD.

The test control circuit 18 receives the address signals ADD (internal address signals A0Z to A5Z), which are supplied to address terminals together with a test command which will be described later, in synchronization with the entry signal ENTRYZ, and outputs a test entry signal ENTZ, a precharge signal PREZ, and a test exit signal EXTZ which control the start or the termination of the test in accordance with the received internal address signals A0Z to A5Z. The test entry signal ENTZ, the precharge signal PREZ, and the test exit signal EXTZ are test control signals which control the test executed in the test mode.

The respective test starting circuits 20 (20a, 20b, 20c, ...) receive the test entry signal ENTZ, the precharge signal PREZ, the test exit signal EXTZ, and the internal address signals IAD, and output test starting signals TESTZ (TEST0Z, TEST1Z, TEST2Z, ...). In this embodiment, the test starting circuit 20a starts a burn-in test, the test starting circuit 20b starts a refresh cycle test where a cycle of self-refresh operation is measured, and the test starting circuit 20c starts a trimming test of the refresh cycle where the cycle of the self-refresh operation is changed. Here, the burn-in test means a test where operation of a circuit in the DRAM is continued for a predetermined period in order to remove initial failure. The self-refresh operation means operation where a refresh request is generated periodically in the DRAM to automatically execute refresh without receiving a refresh command from the exterior. Since the refresh request is generated through the use of a cycle of an oscillator (timer), measurement of the cycle and trimming for optimizing the cycle become necessary.

The operation control circuit 22 receives the test starting signals TESTZ (TEST0Z, TEST1Z, TEST2Z, ...), and outputs control signals CNT for testing the memory core 24 in the test mode, and outputs the test mode signal TESZ at the high level when the test is executed. Further, in the normal operation mode, the operation control circuit 22 receives decoded signals (not shown) of the command signals CMD, and outputs control signals CNT for executing read operation, write operation, or refresh operation, to the memory core 24.

The memory core 24 has a plurality of memory cells MC each of which includes a transfer transistor and a capacitor, word lines WL connected to gates of the transfer transistors of the memory cells MC, and bit lines BL connected to data input/output nodes of the transfer transistors. The bits lines transmit read data, which are read from the memory cells MC via column switches (not shown), to data lines DL, and transmit write data, which are supplied from data input/output terminals DQ via the data lines DL, to the memory cells MC.

In this embodiment, each of the data input/output terminals DQ consists of 16 bits. When the upper byte signal UBB is at the low level, upper 8 bits are valid, while when the lower byte signal LBB is at the low level, lower 8 bits are valid.

Figure 2:
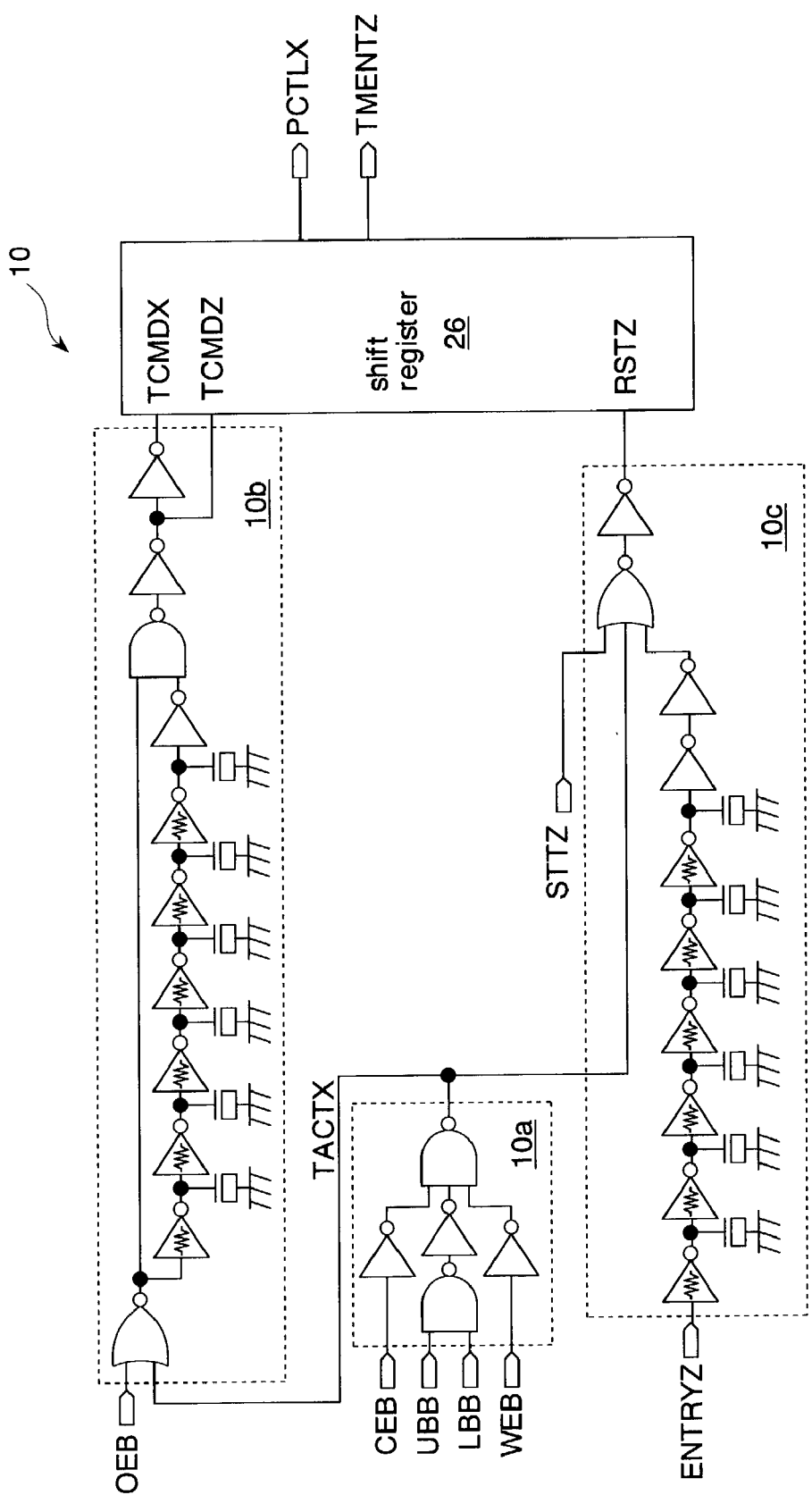
FIG. 2 is a block diagram showing the details of an entry decoder shown in FIG. 1.

FIG. 2 shows the details of the entry decoder 10 shown in FIG. 1. The entry decoder 10 has a decoder 10a, a pulse generator 10b, a reset circuit 10c, and a shift register 26. Delay circuits are included in inverters, which are formed in the pulse generator 10b and the reset circuit 10c and in which resistance symbols are described.

When the decoder 10a receives the chip enable signal CEB and the write enable signal WEB at the low level and the upper byte signal UBB and the lower byte signal LBB at the high level, it outputs a test activation signal TACTX at the low level. The pulse generator 10b outputs pulse signals TCMDZ and TCMDX in synchronization with a falling edge of the output enable signal OEB when the test activation signal TACTX is at the low level. In the normal operation such as read operation or write operation, the write enable signal WEB and the output enable signal OEB are not changed to the low level at the same time. Thus, the combination of the command signals CMD, which is not used in the normal operation, out of the command signals CMD supplied from the command terminals is used as the test command for executing the test. Namely, the entry decoder 10 recognizes the supply of the test command when it receives the chip enable signal CEB, the write enable signal WEB, and the output enable signal OEB at the low level and the upper byte signal UBB and the lower byte signal LBB at the high level at the same time.

The reset circuit 10c outputs a reset signal RSTZ when it receives either one of a start signal STTZ at the high level and the test activation signal TACTX at the high level, or at a predetermined period after it receives the entry signal ENTRYZ at the high level. The shift register 26 operates when the reset signal RSTZ is at the low level. The shift register 26 changes the second entry signal PCTLX to the low level in response to the first pulse signals TCMDZ and TCMDX, and changes the first entry signal TMENTZ to the high level in response to the fourth pulse signals TCMDZ and TCMDX. The first and the second entry signals TMENTZ and PCTLX are reset when the reset signal RSTZ is at the high level, and changed to the low level and the high level respectively.

Figure 3:
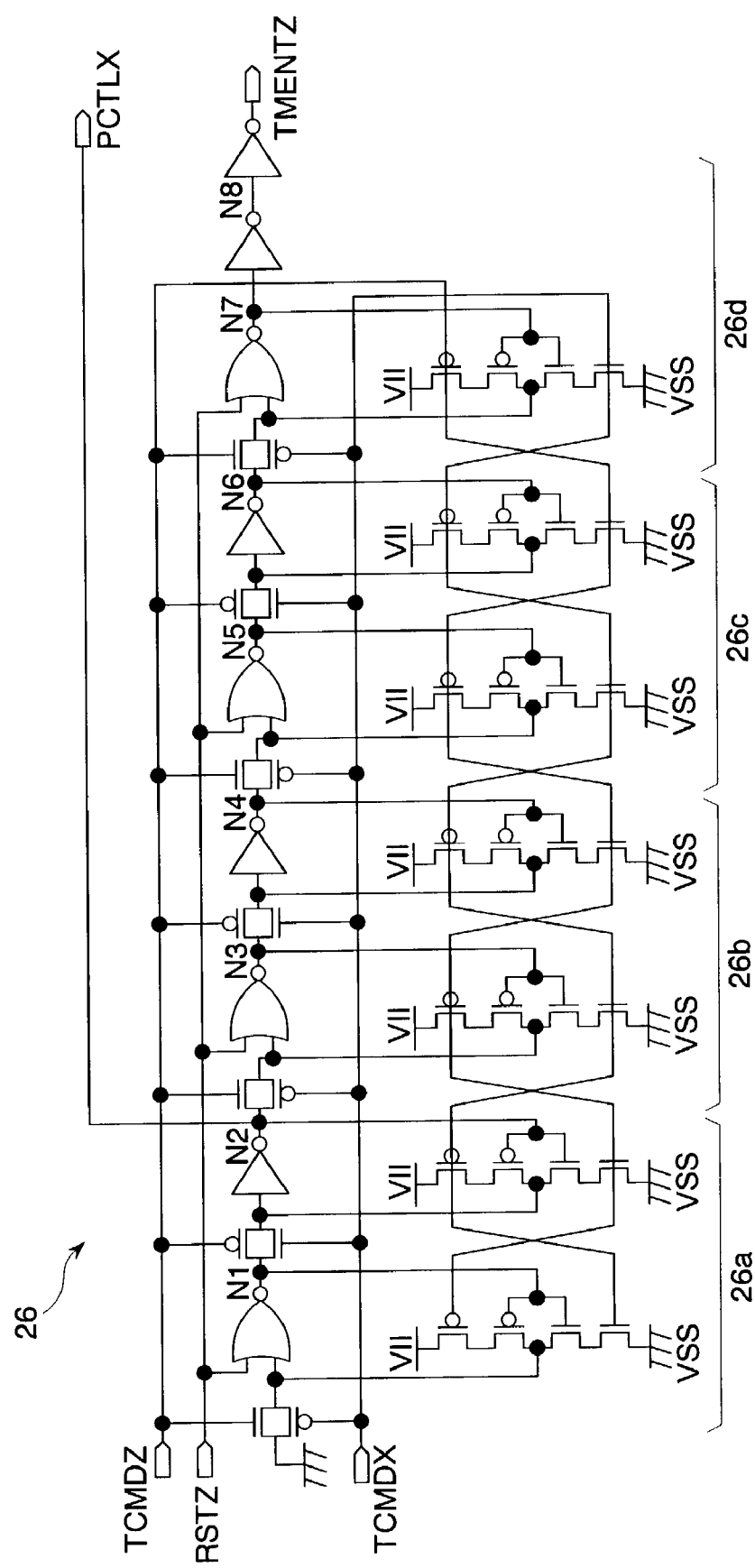
FIG. 3 is a circuit diagram showing the details of a shift register shown in FIG. 2.

FIG. 3 shows the details of the shift register 26 shown in FIG. 2. The shift register 26 has four memory stages 26a, 26b, 26c, and 26d.

Each of the memory stages 26a, 26b, and 26c has a CMOS transmission gate, a NOR gate, a CMOS transmission gate, and an inverter, which are connected in series, a clocked inverter which feeds back an output of the NOR gate to its input, and a clocked inverter which feeds back an output of the inverter to its input. The memory stage 26d has a CMOS transmission gate, a NOR gate, and an inverter, which are connected in series, and a clocked inverter which feeds back an output of the NOR gate to its input.

In each of the memory stages 26a, 26b, 26c, and 26d, the CMOS transmission gate connected to the input of the NOR gate turns on when the pulse signal TCMDZ is at the high level. The CMOS transmission gate connected to the input of the inverter turns on when the pulse signal TCMDZ is at the low level. Another input of the NOR gate receives the reset signal RSTZ. The clocked inverter connected to the NOR gate operates when the pulse signal TCMDZ is at the low level. The clocked inverter connected to the inverter operates when the pulse signal TCMDZ is at the high level. The shift register 26 has a function of a first circuit for generating the first entry signal TMENTZ when it receives the test command for four times after the reset signal RSTZ is cleared, and a function of a second circuit for generating the second entry signal PCTLX every time it receives the test command after the reset signal RSTZ is cleared.

Figure 4:
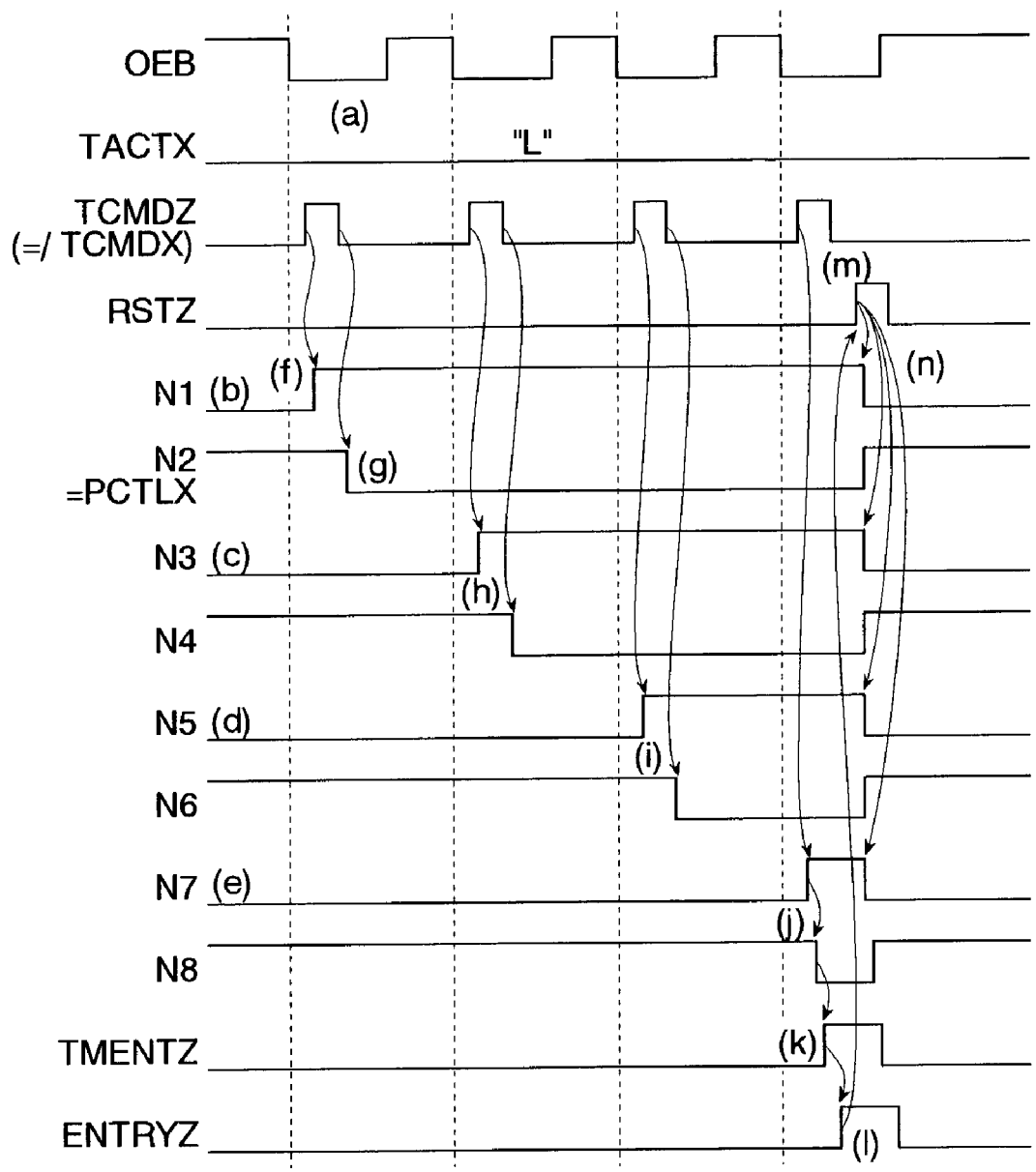
FIG. 4 is a timing chart showing operation of the shift register shown in FIG. 3.

FIG. 4 shows operation of the shift register 26 shown in FIG. 3. In this example, the output enable signal OEB is activated for four times (FIG. 4(a)). Further, since the chip enable signal CEB and the write enable signal WEB have been changed to the low level and the upper byte signal UBB and the lower byte signal LBB have been changed to the high level (not shown), the test activation signal TACTX is maintained at the low level. The pulse signals TCMDZ and TCMDX are generated in response to activation of the output enable signal OEB and the test activation signal TACTX. In the first state of the timing chart, the shirt register 26 has been reset and nodes N1, N3, N5, and N7 have been changed to the low level (FIGS. 4(b), (c), (d), and (e)).

First, in synchronization with a rising edge of the first pulse signal TCMDZ (=a falling edge of TCMDX), the low level is transmitted to the input of the NOR gate of the memory stage 26a, and the node N1 is changed to the high level (FIG. 4(f)). Next, in synchronization with a falling edge of the first pulse signal TCMDZ, the level of the node N1 is transmitted to the node N2 via the inverter, and the node N2 is changed to the low level (FIG. 4(g)). The level of the node N2 is outputted as the second entry signal PCTLX.

Similarly, in synchronization with rising edges and falling edges of the pulse signal TCMDZ, the nodes N3, N5, and N7 are sequentially changed to the high level, and the nodes N4 and N6 are sequentially changed to the low level (FIGS. 4(h), (i), and (j)). In response to the high level of the node N7, the node N8 is changed to the low level, and the first entry signal TMENTZ is changed to the high level (FIG. 4(k)).

Thereafter, in response to the first entry signal TMENTZ, the entry signal ENTRYZ is generated (FIG. 4(l)). In synchronization with the entry signal ENTRYZ, the reset signal RSTZ is generated (FIG. 4(m)), and the shift register 26 is reset (FIG. 4(n)).

Figure 5:
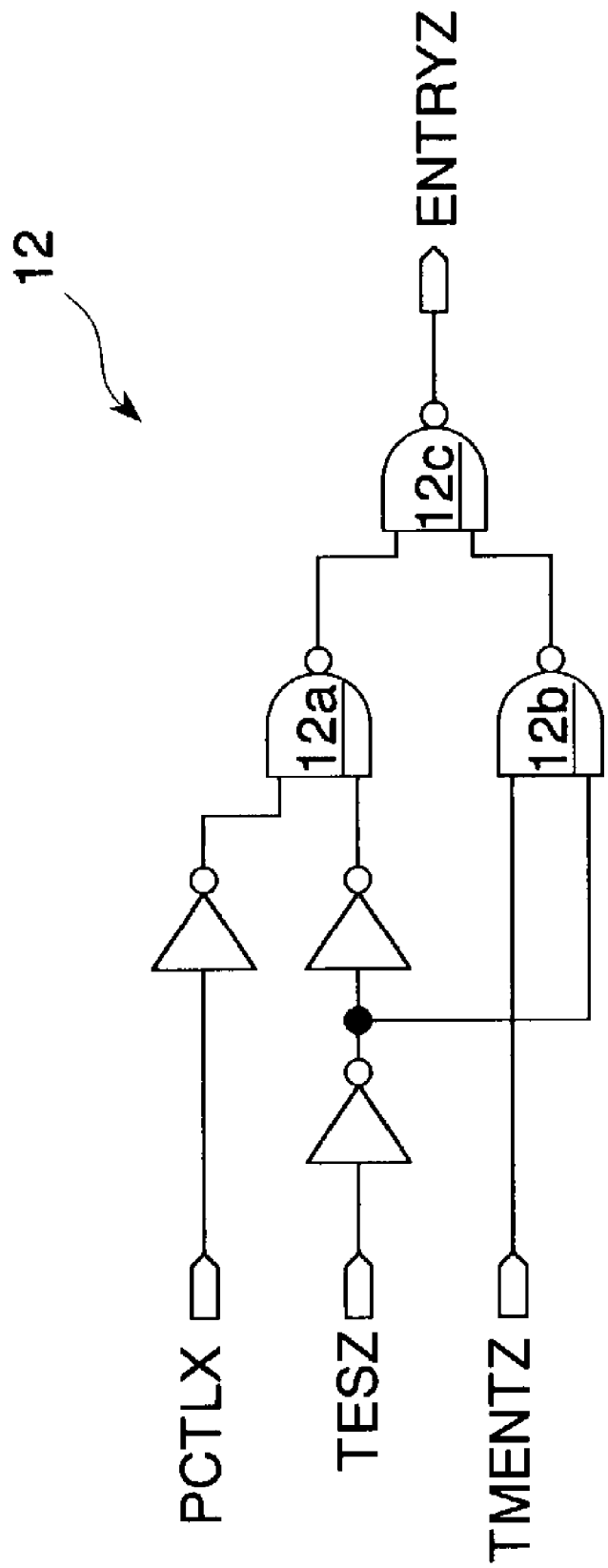
FIG. 5 is a circuit diagram showing the details of an entry generator shown in FIG. 1.

FIG. 5 shows the details of the entry generator 12 shown in FIG. 1. The entry generator 12 has a NAND gate 12a which operates when the test mode signal TESZ is at the high level, a NAND gate 12b which operates when the test mode signal TESZ is at the low level, and a NAND gate 12c (an OR gate of a negative logic) which receives outputs of the NAND gates 12a and 12b and outputs the entry signal ENTRYZ. The entry generator 12 outputs the entry signal ENTRYZ in synchronization with the second entry signal PCTLX when the DRAM is in the test mode (TESZ=high level), and outputs the entry signal ENTRYZ in synchronization with the first entry signal TMENTZ when the DRAM is in the normal operation mode (TESZ=low level). The test mode signal TESZ is changed from the low level to the high level in response to the output of the initial entry signal ENTRYZ. Thus, the entry generator 12 masks the second entry signal PCTLX until the initial entry signal ENTRYZ is outputted, masks the first entry signal TMENTZ after the initial entry signal ENTRYZ is outputted, and outputs the first or the second entry signal TMENTZ or PCTLX, which is not masked, as the entry signal ENTRYZ. Namely, the entry generator 12 operates as a mask circuit for masking the first entry signal TMENTZ or the second entry signal PCTLX. Hence, the entry signal ENTRYZ can be generated by the simple shift register 26 and entry generator 12.

Figure 6:
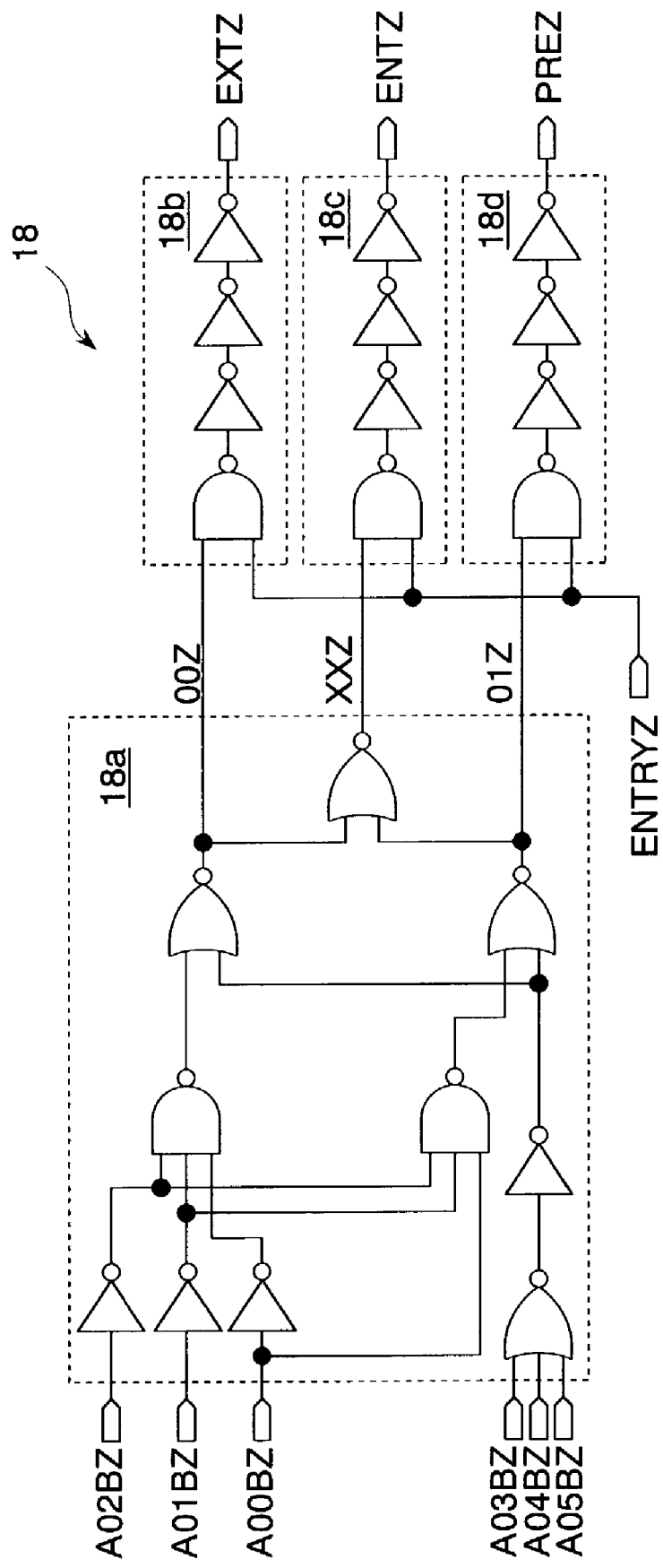
FIG. 6 is a circuit diagram showing the details of a test control circuit shown in FIG. 1.

FIG. 6 shows the details of the test control circuit 18 shown in FIG. 1. The test control circuit 18 has an address decoder 18a which decodes the internal address signals A0Z to A5Z, and NAND circuits 18b, 18c, and 18d which receive outputs of the address decoder 18a and the entry signal ENTRYZ and output a test exit signal EXTZ, a test entry signal ENTZ, and a precharge signal PREZ, respectively.

When the internal address signals A0Z to A5Z are "000000" and "000001" in binary, the address decoder 18a changes decoding signals 00Z and 01Z to the high level respectively, and when the internal address signals A0Z to A5Z are neither "000000" nor "000001" in binary, the address decoder 18a changes a decoding signal XXZ to the high level. When the internal addresses A0Z to A5Z are "000000", the NAND circuit 18b outputs the test exit signal EXTZ in synchronization with the entry signal ENTRYZ. When the internal address signals A0Z to A5Z are neither "000000" nor "000001", the NAND circuit 18c outputs the test entry signal ENTZ in synchronization with the entry signal ENTRYZ. When the internal address signals A0Z to A5Z are "000001", the NAND circuit 18d outputs the precharge signal PREZ in synchronization with the entry signal ENTRYZ.

Figure 7:
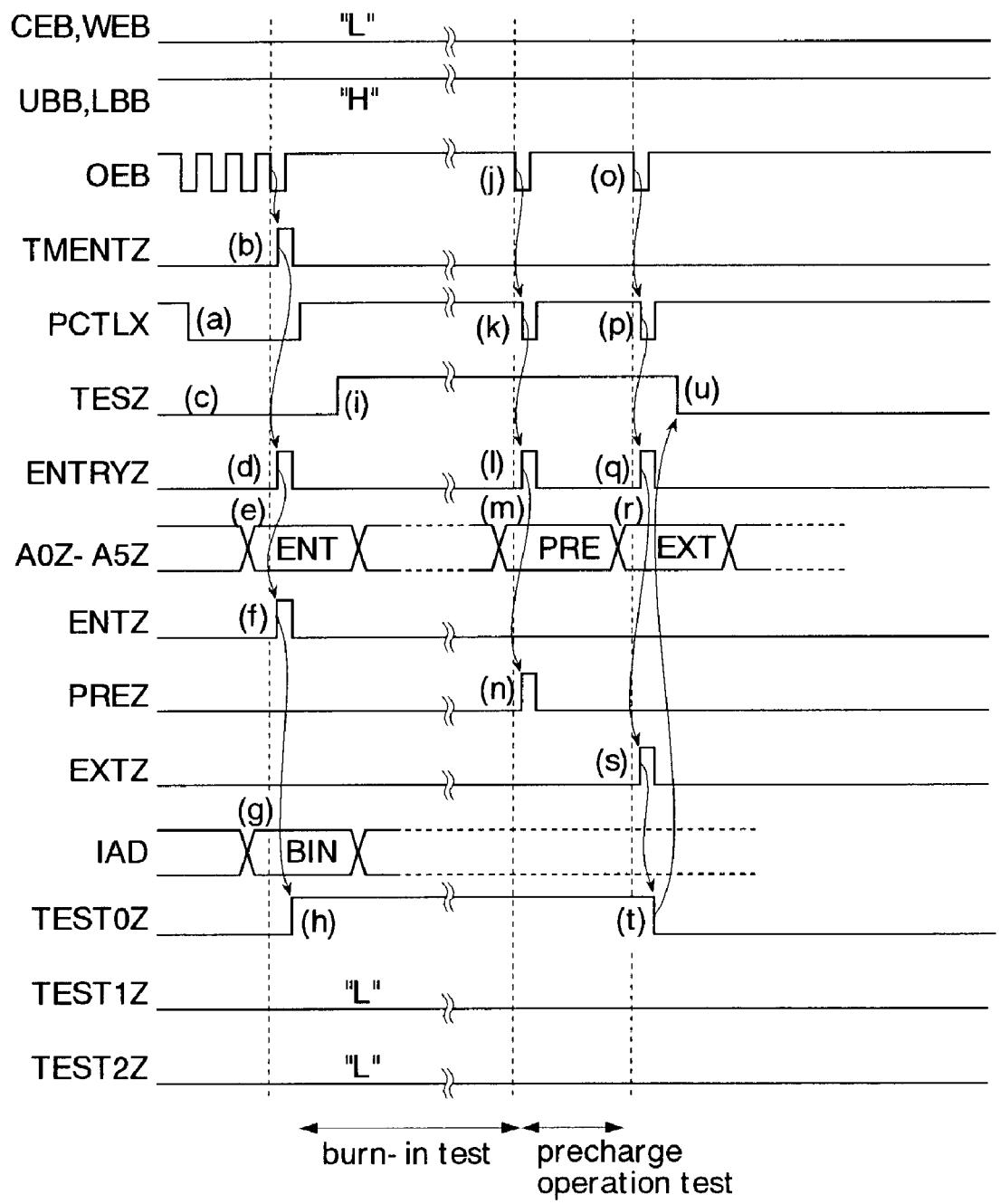
FIG. 7 is a timing chart showing states of main signals for executing a burn-in test.

FIG. 7 shows states of main signals for executing the burn-in test. In this example, the chip enable signal CEB and the write enable signal WEB are set at the low level, the upper byte signal UBB and the lower byte signal LBB are set at the high level, and the output enable signal OEB is repeatedly activated (pulses at the low level). Namely, the activation of the output enable signal OEB is recognized as the test command.

First, as shown in FIG. 4, the entry decoder 10 (FIG. 2) outputs the second entry signal PCTLX and the first entry signal TMENTZ in synchronization with the first and the fourth activation (test commands) of the output enable signal OEB, respectively (FIGS. 7(a) and (b)). At this time, since the DRAM has not shifted to the test mode, the test mode signal TESZ is maintained at the low level (FIG. 7(c)). Therefore, the entry generator (FIG. 5) outputs the entry signal ENTRYZ in synchronization with the first entry signal TMENTZ (FIG. 7(d)). Namely, the first test request is recognized when the fourth test command is received.

In synchronization with the fourth output enable signal OEB (test command), the address signals ADD (internal address signals A0Z to A5Z) showing the entry of the test (ENT) are supplied (FIG. 7(e)). In synchronization with the entry signal ENTRYZ, the test control circuit 18 (FIG. 6) decodes the internal address signals A0Z to A5Z and outputs the test entry signal ENTZ (FIG. 7(f)). Further, in synchronization with the fourth output enable signal OEB, the address signals ADD (internal address signals IAD) showing the burn-in test (BIN) are supplied (FIG. 7(g)). In synchronization with the test entry signal ENTZ, the test starting circuit 20a decodes the internal address signals IAD (BIN) and outputs the test starting signal TEST0Z (FIG. 7(h)). By the activation of the test starting signal TEST0Z, the operation control circuit 22 (FIG. 1) operates and the burn-in test is executed. The operation control circuit 22 changes the test mode signal TESZ, which shows that a state of the DRAM is in the test mode, to the high level in response to the output of the initial entry signal ENTRYZ (FIG. 7(i)). Namely, the state of the DRAM is shifted from the normal operation mode to the test mode. Thereafter, since the test mode signal TESZ at the high level is supplied to the entry generator 12, the NAND gate 12a that receives the second entry signal PCTLX operates. Hence, the entry signal ENTRYZ is outputted every time the output enable signal OEB is activated.

When the burn-in test is terminated, the output enable signal OEB is activated (FIG. 7(j)). The entry decoder 10 outputs the second entry signal PCTLX in synchronization with the activation of the output enable signal OEB (FIG. 7(k)). At this time, since the initial entry signal ENTRYZ has been outputted and the DRAM has shifted to the test mode, the entry generator 12 outputs the entry signal ENTRYZ in synchronization with the second entry signal PCTLX (FIG. 7(l)). The second and subsequent test requests are recognized every time the test command is supplied.

Further, in synchronization with the output enable signal OEB, the address signals ADD (internal address signals A0Z to A5Z) showing the entry of operation (PRE) are supplied (FIG. 7(m)). In synchronization with the entry signal ENTRYZ, the test control circuit 18 decodes the internal address signals A0Z to A5Z and outputs the precharge signal PREZ (FIG. 7(n)). The test starting circuit 20a receives the precharge signal PREZ, stops the burn-in test, and instructs the operation control circuit 22 to enter into a precharge operation test where the bit lines BL are reset to a predetermined voltage.

After the precharge operation test is terminated, the output enable signal OEB is activated again (FIG. 7(o)). In synchronization with the activation of the output enable signal OEB, the entry decoder 10 outputs the second entry signal PCTLX (FIG. 7(p)). The entry generator 12 outputs the entry signal ENTRYZ in synchronization with the second entry signal PCTLX (FIG. 7(q)).

Furthermore, in synchronization with the output enable signal OEB, the address signals ADD (internal address signals A0Z to A5Z) showing the return (EXT) from the test mode to the normal operation mode are supplied (FIG. 7(r)). The test control circuit 18 decodes the internal address signals A0Z to A5Z and outputs the test exit signal EXTZ in synchronization with the entry signal ENTRYZ (FIG. 7(s)). The test starting circuit 20a changes the test starting signal TEST0Z to the low level in response to the test exit signal EXTZ (FIG. 7(t)). The operation control circuit 22 receives the test starting signal TEST0Z at the low level, inactivates a test circuit therein, and changes the test mode signal TESZ to the low level (FIG. 7(u)). Then, the operation mode in the DRAM shifts from the test mode to the normal operation mode.

Figure 8:
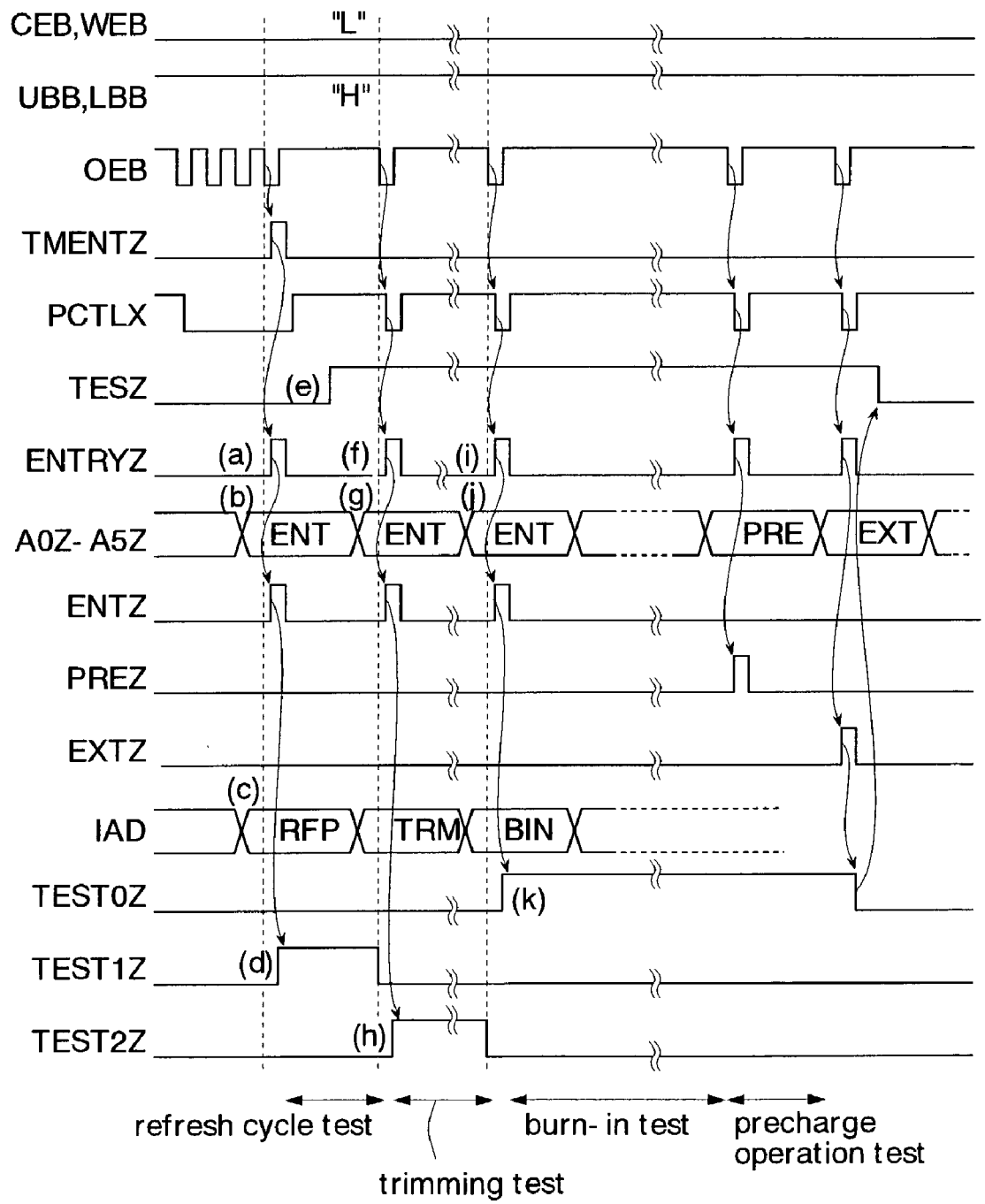
FIG. 8 is a timing chart showing states of main signals for executing a plurality of tests.

FIG. 8 shows states of main signals for executing a plurality of the tests. Detailed explanations of the operations which are the same as those of FIG. 7 will be omitted. In this example, the refresh cycle test for measuring the refresh cycle, the trimming test of the refresh cycle, and the burn-in test are sequentially executed.

First, similarly to FIG. 7, the output enable signal OEB is supplied for four times and the entry signal ENTRYZ is outputted (FIG. 8(a)). In synchronization with the fourth output enable signal OEB, the address signals ADD (internal address signals A0Z to A5Z) showing the entry of the test (ENT) and the address signals ADD (internal address signals IAD) showing the refresh cycle test (REP) are supplied (FIGS. 8(b) and (c)). In synchronization with the test entry signal ENTZ, the test starting circuit 20b decodes the internal address signals IAD (REP) and outputs the test starting signal TEST1Z (FIG. 8(d)). By the activation of the test starting signal TEST1Z, the operation control circuit 22 operates and the refresh cycle is measured. The operation control circuit 22 changes the test mode signal TESZ to the high level (FIG. 8(e)).

After the refresh cycle test is terminated, the output enable signal OEB is activated again, and the second entry signal PCTLX and the entry signal ENTRYZ are outputted (FIG. 8(f)). In synchronization with the output enable signal OEB, the address signals ADD (internal address signals A0Z to A5Z) showing the entry of the test (ENT) are supplied again (FIG. 8(g)). The test starting circuit 20c decodes the internal address signals IAD (TRM) and outputs the test starting signal TEST2Z in synchronization with the test entry signal ENTZ (FIG. 8(h)). By the activation of the test starting signal TEST2Z, the operation control circuit 22 operates and the refresh cycle is trimmed.

After the trimming test is terminated, the output enable signal OEB is activated again, and the second entry signal PCTLX and the entry signal ENTRYZ are outputted (FIG. 8(i)). In synchronization with the output enable signal OEB, the address signals ADD (internal address signals A0Z to A5Z) showing the entry of the test (ENT) are supplied again (FIG. 8(j)). The test starting circuit 20c decodes the internal address signals IAD (BIN) and outputs the test starting signal TEST0Z in synchronization with the test entry signal ENTZ (FIG. 8(k)). By the activation of the test starting signal TEST0Z, the operation control circuit 22 operates and the burn-in test is executed.

Thereafter, similarly to FIG. 7, the address signals ADD are supplied in synchronization with the output enable signal OEB, and the precharge operation test and exit operation from the test mode are executed.

As described above, in this embodiment, the entry signal ENTRYZ is generated to start the test when the test command is received for four times successively in the normal operation mode. Further, after the entry signal ENTRYZ is generated for the first time and the operation mode shifts to the test mode, the entry signal ENTRYZ is generated to start or terminate the test every time the test command is received once. Accordingly, after the operation mode shifts to the test mode, the time required from the receipt of the test command to the start of the test can be shortened and the test time can be shortened. Particularly, when a plurality of the tests is successively executed, great benefit can be obtained. In addition, by applying the present invention to the start and the termination of the burn-in test, whose test time is long, the test time can be further shortened.

In order to start the test in the normal operation mode, it is necessary to receive the test command for four times successively. Therefore, there is no case that the entry signal is generated accidentally due to noise or the like to execute the test in the normal operation. Namely, the test time can be shortened without decreasing the operation reliability of the DRAM.

The start or the termination of the test is determined in accordance with the address signals ADD, which are supplied together with the test command. Accordingly, the start or the termination of the test can be easily identified. Further, since the address terminals used in the normal operation mode can be also used as test terminals, it is unnecessary to newly form the test terminals. Therefore, the chip size can be prevented from increasing.

The entry signal ENTRYZ is generated by outputting the second entry signal PCTLX and the first entry signal TMENTZ by turns from the memory stages 26a and 26b of the shift register 26 (entry decoder 10) and masking either one of these signals PCTLX and TMENTZ by the entry generator 12 (mask circuit). Therefore, the entry signal ENTRYZ can be easily generated by the simple circuit.

As the test command, the combination of the command signals, which is not used in the normal operation, out of the command signals CMD supplied via the command terminals is allocated to the test command. Hence, it is unnecessary to newly form the test Image Page 4 terminals and the chip size can be prevented from increasing.

Incidentally, in the above-described embodiment, the example in which the present invention is applied to the clock asynchronous DRAM is descried. The present invention is not limited to such an embodiment. For example, the present invention may be applied to a clock synchronous SDRAM (Synchronous DRAM).

In the above-descried embodiment, the example in which the present invention is applied to the DRAM is described. The present invention is not limited to such an embodiment. For example, the present invention may be applied to other semiconductor memories such as an SRAM or a flash memory, a microcomputer, a logic LSI, or the like.

The invention is not limited to the above embodiments and various modifications may be made without departing from the spirit and scope of the invention. Any improvement may be made in part or all of the components.

What is claimed is:

1. A semiconductor integrated circuit comprising
an entry circuit for
outputting an initial entry signal to start any one of a plurality of tests when the entry circuit receives a test command n times and,
after the output of said initial entry signal, outputting subsequent entry signals which start or terminate any one of said tests every time the entry circuit receives said test command a predetermined number of times which is less than said n times,
wherein n is an integer greater than or equal to 2.

2. The semiconductor integrated circuit according to claim 1, further comprising
a test control circuit for receiving, in synchronization with each of said entry signals, address signals which are supplied to address terminals together with said test command and outputting test control signals which control the start or the termination of said tests in accordance with said address signals received.

3. The semiconductor integrated circuit according to claim 2, further comprising
a memory core having a plurality of memory cells and bit lines for transmitting data which are read from the memory cells, wherein
said tests started by said entry signals include a burn-in test of said memory cells and a precharge operation test for resetting said bit lines to a predetermined voltage after the burn-in test.

4. The semiconductor integrated circuit according to claim 1, wherein
said entry circuit includes:
a first circuit for generating a first entry signal when said test command is received n times;
a second circuit for generating a second entry signal every time said test command is received said predetermined number of times; and a mask circuit for masking said second entry signal until said initial entry signal is outputted, masking said first entry signal after said initial entry signal is outputted, and outputting said first or second entry signal, which is not masked, as said initial or subsequent entry signal.

5. The semiconductor integrated circuit according to claim 1, further comprising a normal operation mode and a test mode as operation modes, wherein said test command is recognized by a combination of command signals which is not used in said normal operation mode, out of command signals supplied to command terminals which are composed of a plurality of bits.

6. The semiconductor integrated circuit according to claim 1, further comprising a normal operation mode and a test mode as operation modes, wherein the operation mode in the integrated circuit shifts from the normal operation mode to the test mode when said initial entry signal is outputted.

7. The semiconductor integrated circuit according to claim 6, wherein said predetermined number of times is once.

8. A method for testing a semiconductor integrated circuit, comprising the steps of:

recognizing a first test request to start any one of a plurality of tests when a test command is received n successive times; and after said first test request is recognized, recognizing a test request to start or terminate any one of said tests every time said test command is received a predetermined number of times which is less than said n times, wherein n is an integer greater than or equal to 2.

9. The method for testing the semiconductor integrated circuit according to claim 8, wherein the start or the termination of said tests is identified in accordance with address signals supplied together with said test command.

10. A method for testing a semiconductor integrated circuit, comprising the steps of:

in a normal operation mode, recognizing a first test request to shift an operation mode in the integrated circuit to a test mode when a test command is received n times, and executing any one of a plurality of tests in accordance with address signals supplied to address terminals together with said test command; and in said test mode, recognizing said test request every time said test command is received a predetermined number of times which is less than said n times, and executing any one of said tests or shifting the operation mode in the integrated circuit from the test mode to said normal operation mode in accordance with said address signals supplied together with said test command, wherein n is an integer greater than or equal to 2.

* * * * *